US012672547B2

(12) United States Patent (10) Patent No.: US 12,672,547 B2
Chiu et al. (45) **Date of Patent: \*Jun. 30, 2026**

(54) ELECTRONIC PACKAGE AND MANUFACTURING METHOD THEREOF

(71) Applicant: SILICONWARE PRECISION INDUSTRIES CO., LTD., Taichung City (TW)

(72) Inventors: Chih-Hsien Chiu, Taichung City (TW); Wen-Jung Tsai, Taichung City (TW); Chien-Cheng Lin, Taichung City (TW); Ko-Wei Chang, Taichung City (TW); Yu-Wei Yeh, Taichung City (TW); Shun-Yu Chien, Taichung City (TW); Chia-Yang Chen, Taichung City (TW)

(73) Assignee: SILICONWARE PRECISION INDUSTRIES CO., LTD., Taichung City (TW)

( * ) Notice: Subject to any disclaimer, the term of this patent is extended or adjusted under 35 U.S.C. 154(b) by 125 days.

This patent is subject to a terminal disclaimer.

(21) Appl. No.: 18/660,845

(22) Filed: May 10, 2024

(65) Prior Publication Data

US 2024/0297126 A1 Sep. 5, 2024

Related U.S. Application Data

(63) Continuation of application No. 17/571,901, filed on Jan. 10, 2022, now Pat. No. 12,057,409.

(30) Foreign Application Priority Data

Nov. 22, 2021 (TW) .................................. 110143376

(51) Int. Cl.
| | | |
|---|---|---|
| *H10W 42/00* | (2026.01) | |
| *H10W 42/20* | (2026.01) | |
| *H10W 70/685* | (2026.01) | |
| *H10W 74/10* | (2026.01) | |

(52) U.S. Cl.
CPC ....... *H10W 42/121* (2026.01); *H10W 70/685* (2026.01); *H10W 74/114* (2026.01)

(58) Field of Classification Search
CPC .............. H01L 23/562; H01L 23/3121; H01L 23/49822; H01L 23/585; H01L 23/552; H10W 42/121; H10W 42/276; H10W 90/00; H10W 90/701
See application file for complete search history.

(56) References Cited

U.S. PATENT DOCUMENTS

| | | | |
|---|---|---|---|
| 9,837,376 | B2 | 12/2017 | Ko et al. |
| 12,057,409 | B2 * | 8/2024 | Chiu ....................... H01L 23/16 |
| 2012/0104598 | A1 | 5/2012 | Hsu et al. |
| 2013/0313698 | A1 | 11/2013 | Chen et al. |
| 2015/0145747 | A1 | 5/2015 | Chung et al. |
| 2019/0214352 | A1 * | 7/2019 | Tsai .................. H01L 23/49838 |

* cited by examiner

*Primary Examiner* — Monica D Harrison
*Assistant Examiner* — Jacob T Nelson
(74) *Attorney, Agent, or Firm* — Dority & Manning, PA

(57) ABSTRACT

An electronic package is provided in which an electronic component is arranged on a wiring structure and covered with a packaging layer, and a frame body that does not contact the wiring structure is embedded in the packaging layer.

24 Claims, 11 Drawing Sheets

ELECTRONIC PACKAGE AND MANUFACTURING METHOD THEREOF

CROSS-REFERENCE TO RELATED APPLICATIONS

The present application is a continuation of U.S. patent application Ser. No. 17/571,901, filed on Jan. 10, 2022, which, in turn, is based upon and claims the right of priority to TW Patent Application No. 110143376, filed Nov. 22, 2021, the disclosure of which is hereby incorporated by reference herein in its entirety for all purposes.

BACKGROUND

1. Technical Field

The present invention relates to a semiconductor device, and more particularly, to a warpage-proof electronic package and a manufacturing method thereof.

2. Description of Related Art

With the vigorous development of portable electronic products in recent years, various related products have been gradually developing toward high-density, high-performance, and being light, thin, short, and small. Various types of semiconductor packaging structures that are applied to the portable electronic products are thus rolled out, in order to meet the demands for lightweight, thinness, small size and high-density.

FIG. 1 is a schematic cross-sectional view of a conventional semiconductor package 1. As shown in FIG. 1, the semiconductor package 1 is provided with at least one semiconductor chip 11 disposed on a packaging substrate 10 in a flip chip manner, at least one dummy block 12 provided around the semiconductor chip 11 on the packaging substrate 10, a packaging layer 14 formed on the packaging substrate 10 to cover the semiconductor chip 11, and then a plurality of solder balls 17 formed under the packaging substrate 10 to connect to a circuit board (not shown in the figure).

In the aforementioned semiconductor package 1, a mismatch between the coefficients of thermal expansion (CTE) of the semiconductor chip 11 and the packaging layer would easily result in non-uniform thermal stress, causing the packaging layer 14 to warp during thermal cycles. Therefore, the dummy block 12 is arranged around the semiconductor chip 11 to reduce the degree of warpage.

In the conventional semiconductor package 1, however, the dummy block 12 occupies a very large surface area of the packaging substrate 10, leaving no space to arrange other electronic components on the surface of this area. Therefore, if there are demands for other electronic components, the size of the packaging substrate 10 needs to be increased to arrange the required wiring layers. This could hardly meet the demand for miniaturization, but increases manufacturing costs.

Therefore, how to overcome the above-mentioned problems of the prior art has become an urgent issue to be solved at present.

SUMMARY

In view of the various deficiencies of the prior art, the present invention provides an electronic package comprising: a wiring structure; at least one electronic component provided on and electrically connected to the wiring structure; a packaging layer formed on the wiring structure to cover the electronic component, wherein the packaging layer has a first surface and a second surface opposite to each other and side surfaces adjacent to the first and second surfaces, and the packaging layer is bonded to the wiring structure via its second surface; and a frame body embedded in the packaging layer, wherein the frame body neither contacts the wiring structure nor covers the electronic component.

The present invention also provides a manufacturing method of an electronic package, comprising: providing a frame body and at least one electronic component on a wiring structure, wherein the frame body neither contacts the wiring structure nor covers the electronic component; and forming a packaging layer on the wiring structure such that the packaging layer covers the electronic component and the frame body, wherein the packaging layer has a first surface and a second surface opposite to each other and side surfaces adjacent to the first and second surfaces, so that the packaging layer is bonded to the wiring structure via its second surface.

In the aforementioned electronic package and manufacturing method thereof, the electronic component is exposed from the first surface of the packaging layer.

In the aforementioned electronic package and manufacturing method thereof, the frame body is exposed from the side surface and/or the first surface of the packaging layer.

In the aforementioned electronic package and manufacturing method thereof, the frame body is flush with the side surface and/or the first surface of the packaging layer.

In the aforementioned electronic package and manufacturing method thereof, the frame body is made of a metal or semiconductor material.

In the aforementioned electronic package and manufacturing method thereof, the frame body has a ring shape to surround the electronic component.

In the aforementioned electronic package and manufacturing method thereof, the frame body is suspended on the wiring structure.

In the aforementioned electronic package and manufacturing method thereof, the frame body is provided on the wiring structure by supporting legs.

The aforementioned electronic package and manufacturing method thereof further comprise another electronic component provided on the wiring structure, and the another electronic component is covered by the frame body.

The aforementioned electronic package and manufacturing method thereof further comprise a shielding layer formed on the packaging layer.

In the aforementioned electronic package and manufacturing method thereof, the frame body has a plurality of opening areas, and a plurality of the electronic components are provided on the wiring structure, so that the plurality of the electronic components are respectively exposed from the plurality of opening areas.

It can be seen from the above that the electronic package and manufacturing method thereof of the present invention mainly use the frame body to disperse thermal stress, so that warpage of the packaging layer can be avoided during thermal cycles. Additionally, other electronic components can be arranged around the electronic component. Therefore, compared with the prior art, the electronic package of the present invention allows for the arrangement of required wirings on the surface of the wiring structure without increasing the size of the wiring structure. Such advantages not only meet the demand for miniaturization, but also reduce manufacturing costs.

BRIEF DESCRIPTION OF THE DRAWINGS

FIG. 3C-1 is a schematic cross-sectional view of FIG. 3C taken along X-X.

FIG. 3C-2 is a schematic cross-sectional view of FIG. 3C taken along Z-Z.

FIGS. 4A-1 and 4A-2 are schematic views of another aspect of FIGS. 3C-1 and 3C-2.

FIG. 8A-1 is a schematic cross-sectional view of a fifth embodiment of a manufacturing method of an electronic package of the present invention.

FIG. 8A-2 is a schematic cross-sectional view of a top view of FIG. 8A-1.

FIG. 8B-1 is a schematic cross-sectional view of another aspect of FIG. 8A-1.

FIG. 8B-2 is a schematic cross-sectional view of a top view of FIG. 8B-1.

DETAILED DESCRIPTIONS

The following describes the implementation of the present invention with specific examples. Those skilled in the art can easily understand other advantages and effects of the present invention from the contents disclosed in this specification.

It should be understood that, the structures, ratios, sizes, and the like depicted in the accompanying figures are all used only to illustrate the contents disclosed in the present specification for one skilled in the art to read and comprehend rather than to limit the conditions for practicing the present disclosure. Therefore, these structures, ratios, sizes and the like carry no substantial technical meanings. Any modification of the structure, alteration of the ratio relationship, or adjustment of the size without affecting the possible effects and achievable proposes of the present invention should still be deemed as falling within the scope of the technical disclosure of the present invention. Meanwhile, terms such as "upper," "first," "second," "a" and the like used herein are used merely for clear explanation rather than limiting the practicable scope of the present disclosure, and thus, any alterations or adjustments of the relative relationships thereof without essentially altering the technical contents should be considered in the practicable scope of the present disclosure.

FIGS. 2A to 2D are schematic cross-sectional views of a first embodiment of a manufacturing method of an electronic package 2 of the present invention.

Figure 2A:
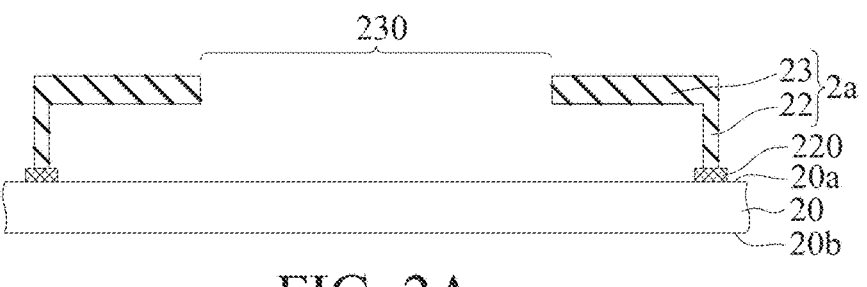
FIGS. 2A to 2D are schematic cross-sectional views of a first embodiment of a manufacturing method of an electronic package of the present invention.

As shown in FIG. 2A, a wiring structure 20 which has a first side 20a (such as an upper side) and a second side 20b (such as a lower side) opposite to each other is provided, and at least one supporting structure 2a is provided on the first side 20a of the wiring structure 20.

In this embodiment, the wiring structure 20 is, for example, a packaging substrate with a core layer and a wiring layer, a coreless packaging substrate, a through-silicon interposer (TSI) with through-silicon vias (TSV), or other types of plate having at least one insulating layer and at least one wiring layer, e.g., a fan out type redistribution layer (RDL), bonded to the insulating layer. For example, the material forming the wiring layer is copper, and the material forming the insulating layer is, for example, a dielectric material such as polybenzoxazole (PBO), polyimide (PI), or prepreg (PP). It should be understood that the wiring structure 20 can also be other sheets carrying chips, such as a lead frame, a wafer, or other boards having metal routing, and is not limited to the above.

Furthermore, the supporting structure 2a is a metal frame of, for example, copper or a semiconductor frame of, for example, silicon or glass, which has at least one supporting leg 22 combined with the wiring structure 20 and at least one frame body 23 provided on the supporting legs 22. For example, the supporting leg 22 is adhered to the first side 20a of the wiring structure 20 by a bonding material 220 such as glue, and the frame body 23 has an opening area 230 to have the first side 20a of the wiring structure 20 exposed therefrom.

Figure 2B:
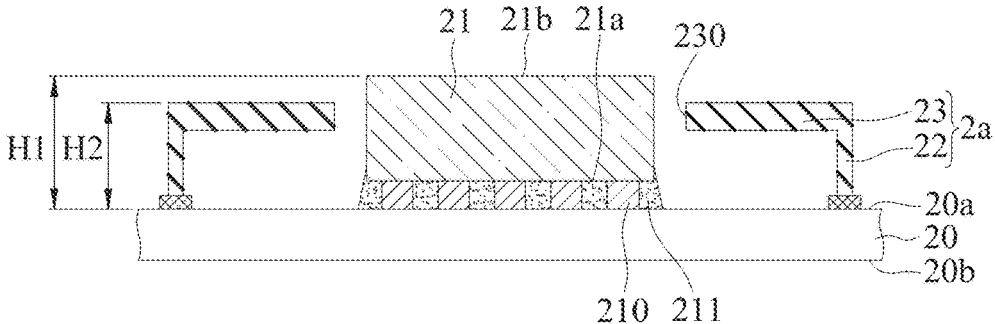

As shown in FIG. 2B, at least one electronic component 21 is provided on the first side 20a of the wiring structure 20, and the electronic component 21 is exposed in the opening area 230.

In this embodiment, the electronic component 21 is an active component, a passive component, or a combination thereof, wherein the active component is, for example, a semiconductor chip, and the passive component is, for example, a resistor, a capacitor and an inductor. For example, the electronic component 21 is a semiconductor chip, which has an active surface 21a and an inactive surface 21b opposite to each other, wherein electrode pads (not shown in the figure) of the active surface 21a are arranged on the wiring structure 20 in a flip chip manner by a plurality of conductive bumps 210 such as solder materials, metal pillars or the like, and are electrically connected to the wiring layer of the wiring structure 20, and then the conductive bumps 210 are covered with a underfill 211; alternatively, the electronic component 21 can be electrically connected to the wiring layer of the wiring structure 20 through a plurality of bonding wires (not shown in the figure) by means of wire bonding; and alternatively, the electronic component 21 can directly contact the wiring layer of the wiring structure 20. Therefore, desired types and quantity of electronic components can be connected to the wiring structure 20 to improve its electrical performance.

There are various ways, not limited to the above, to electrically connect the electronic component 21 to the wiring structure 20.

Furthermore, the electronic component 21 is aligned with the opening area 230, such that the frame body 23 surrounds the electronic component 21, and the inactive surface 21b is completely exposed from the opening area 230. For example, a height H1 of the electronic component 21 relative to the first side 20a of the wiring structure 20 is greater than a height H2 of the supporting structure 2a relative to the first side 20a of the wiring structure 20.

Figure 2C:
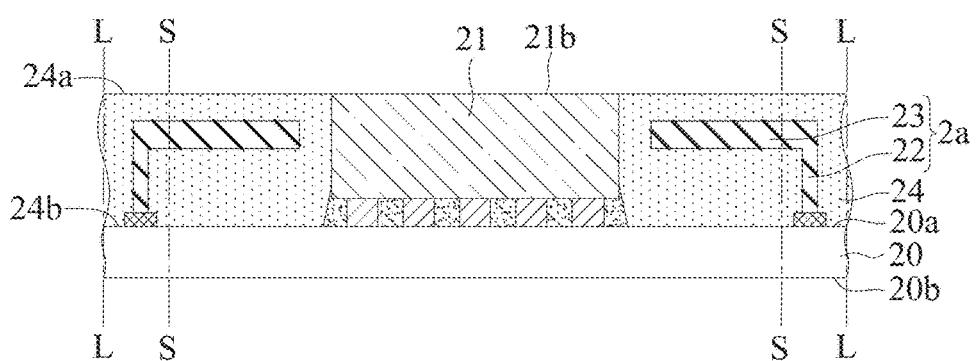

As shown in FIG. 2C, a packaging layer 24 is formed on the first side 20a of the wiring structure 20, such that the packaging layer 24 covers the support structure 2a and the electronic component 21, wherein the packaging layer 24 has a first surface 24a and a second surface 24b opposite to each other, the electronic component 21 is exposed on the first surface 24a of the packaging layer 24, and the packaging layer 24 is bonded to the first side 20a of the wiring structure 20 via its second surface 24b.

In this embodiment, the packaging layer 24 is an insulating material, such as polyimide (PI), dry film, encapsulant such as epoxy, or a packaging material (molding compound). For example, the packaging layer 24 can be formed on the first side 20a of the wiring structure 20 by a process selected from liquid compound, injection, lamination or compression molding, and the like.

Furthermore, partial materials of the packaging layer 24 (even partial materials of the inactive surface 21b of the electronic component 21) can be removed by a planarization process, such as polishing, to make the first surface 24a of the packaging layer 24 flush with the inactive surface 21b of the electronic component 21, so that the inactive surface 21b of the electronic component 21 is exposed from the first surface 24a of the packaging layer 24.

Figure 2D:
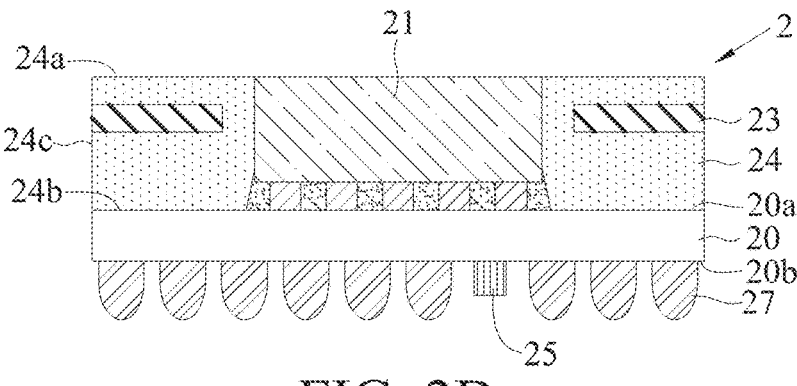

As shown in FIG. 2D, the supporting leg 22 is used as a cutting path S (as shown in FIG. 2C) to perform a singulation process therealong, so that the packaging layer 24 defines side surfaces 24c adjacent to the first and second surfaces 24a, 24b, so as to produce the electronic package 2 of the present invention.

In this embodiment, a plurality of conductive components 27 can be formed on the second side 20b of the wiring structure 20, so that the conductive components 27 are electrically connected to the wiring layer of the wiring structure 20.

Figure 3A:
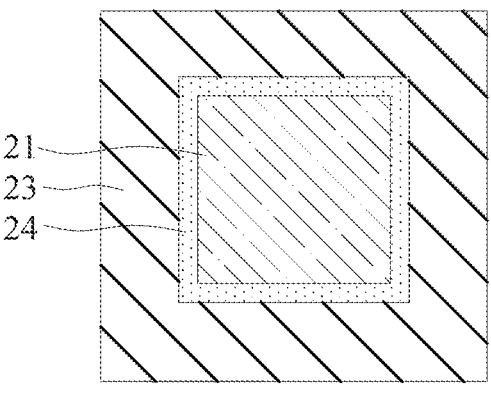
FIG. 3A is a schematic cross-sectional view of a top view of FIG. 2D.
Figure 3B:
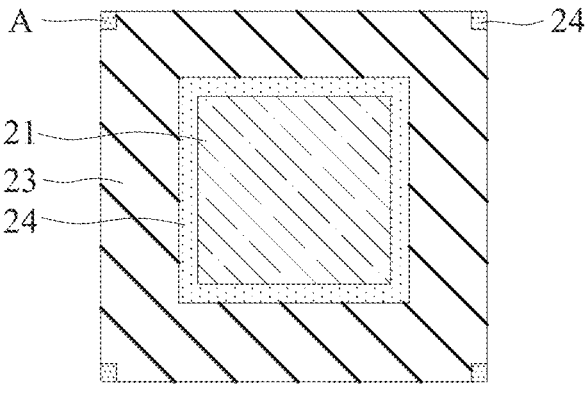
FIG. 3B is a schematic view of another aspect of FIG. 3A.
Figure 3C:
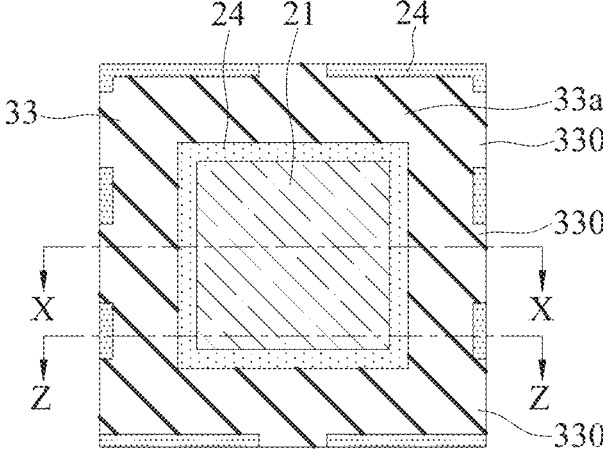
FIG. 3C is a schematic view of another aspect of FIG. 3B.
Figures 1, 3C:
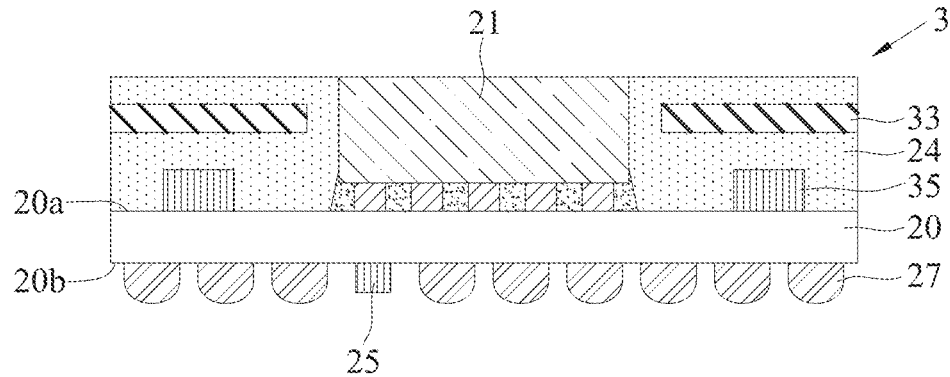

Furthermore, the frame body 23 is exposed on the side surfaces 24c of the packaging layer 24, and the shape of a top surface of the frame body 23 can be a general ring shape (as shown in FIG. 3A) or a ring shape with missing corners A (as shown in FIG. 3B) or a ring with toothed edges (as shown in FIG. 3C). For example, the frame body 33 with a tooth-edged ring has tooth portions 330 and a ring portion 33a. The tooth portions 330 are exposed from the side surfaces 24c of the packaging layer 24 (as shown in FIG. 3C-1), and the ring portion 33a is embedded in the packaging layer 24 without being exposed from the side surfaces 24c of the packaging layer 24 (as shown in FIG. 3C-2).

Figure 1:
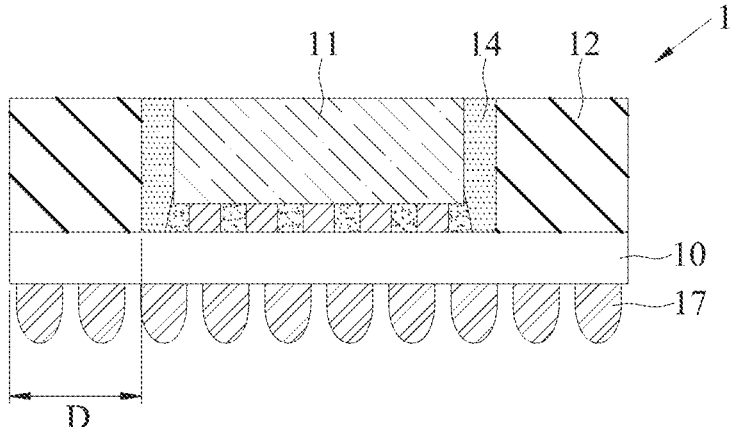
FIG. 1 is a schematic cross-sectional view of a conventional semiconductor package.
Figures 2, 3C:
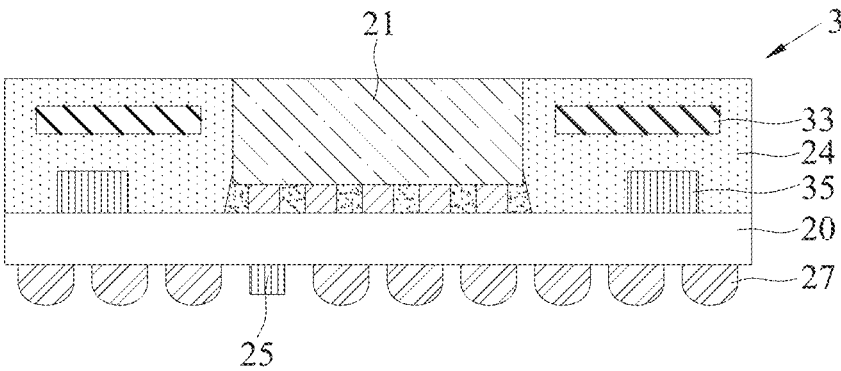
Figures 1, 2, 4A:
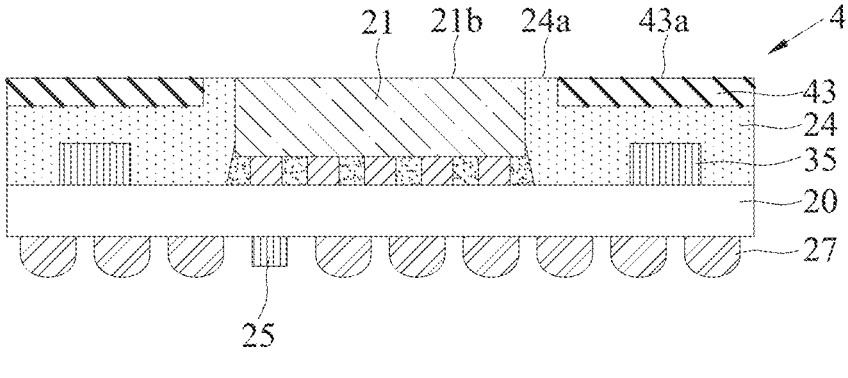
Figure 4B:
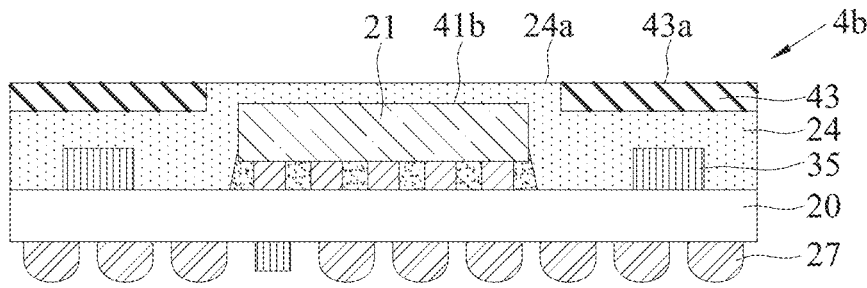
FIG. 4B is a schematic view of another aspect of FIG. 4A-1.
Figure 4C:
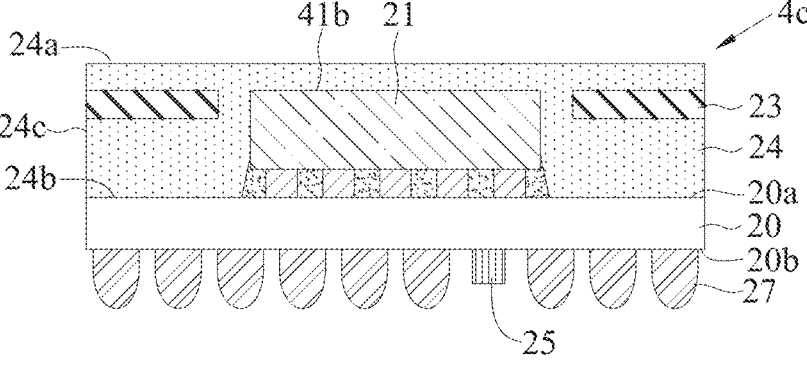
FIG. 4C is a schematic view of another aspect of FIG. 4B.

Alternatively, as shown in FIGS. 4A-1 and 4A-2, the frame body 43 (for example, a frame body with a tooth-edged ring) may also be exposed from the first surface 24a of the packaging layer 24. A planarization process can be employed to remove, by polishing, partial materials of the packaging layer 24 and partial materials of the inactive surface 21b of the electronic component 21 (even partial surfaces of the frame body 43), to make the first surface 24a of the packaging layer 24 flush with the inactive surface 21b of the electronic component 21 and a surface 43a of the frame body 43, so that the inactive surface 21b of the electronic component 21 and the frame body 43 are exposed from the first surface 24a of the packaging layer 24. It should be understood that, as in an electronic package 4b shown in FIG. 4B, an inactive surface 41b of the electronic component 21 can also be embedded in the first surface 24a of the packaging layer 24, and only the surface 43a of the frame body 43 is exposed therefrom. Therefore, the inactive surface 41b of the electronic component 21 and the frame body 23 may be unexposed from the first surface 24a of the packaging layer 24 at the same time, as shown in FIG. 4C.

In addition, at least one passive component 35 can also be arranged on the first side 20a of the wiring structure 20, as shown in FIG. 3C-1, such that the frame body 33 covers the passive component 35. It should be understood that at least one passive component 25 can also be arranged on the second side 20b of the wiring structure 20 as required, as shown in FIG. 2D.

Therefore, the manufacturing method of the present invention employs mainly a design of the frame body 23, 33, and 43 to disperse thermal stress and avoid warpage during thermal cycles.

Furthermore, the frame body 23, 33, 43 is suspended on the first side 20a of the wiring structure 20, and thus does not occupy a surface area of the first side 20a of the wiring structure 20, so as to facilitate the arrangement of other electronic components (such as the passive component 35) around the electronic component 21, wherein the frame body 33, 43 covers the passive component 35. Therefore, compared with the prior art, the electronic package 2, 3, 4, 4b of the present invention can have required wirings arranged on the surface of the first side 20a of its wiring structure 20 without increasing the size of the first side 20a of the wiring structure 20. Consequently, the electronic package of the present application can not only meet the demand for miniaturization, but also reduce manufacturing costs.

Figure 5A:
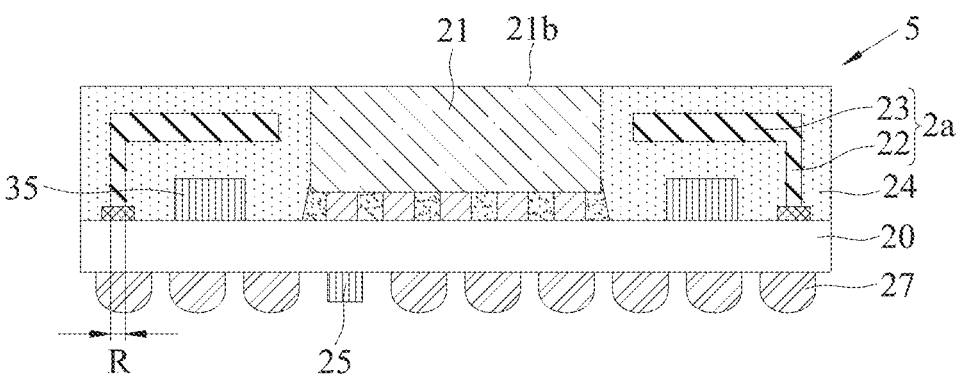
FIG. 5A is a schematic cross-sectional view of a second embodiment of a manufacturing method of an electronic package of the present invention.
Figure 5B:
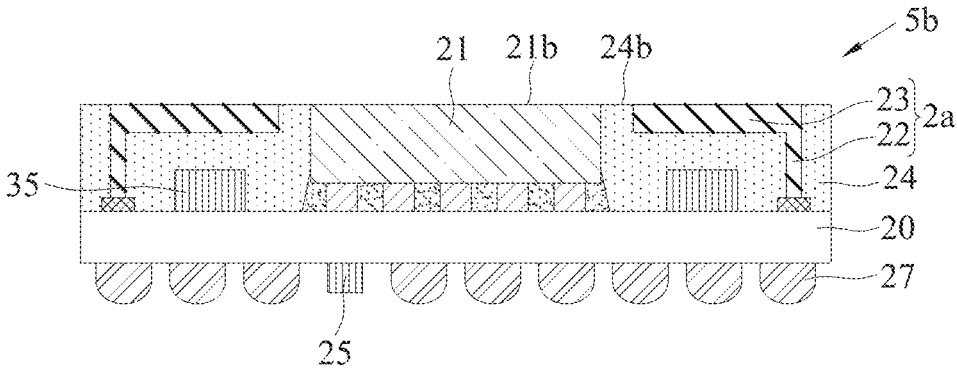
FIGS. 5B and 5C are schematic views of other different aspects of FIG. 5A.
Figure 5C:
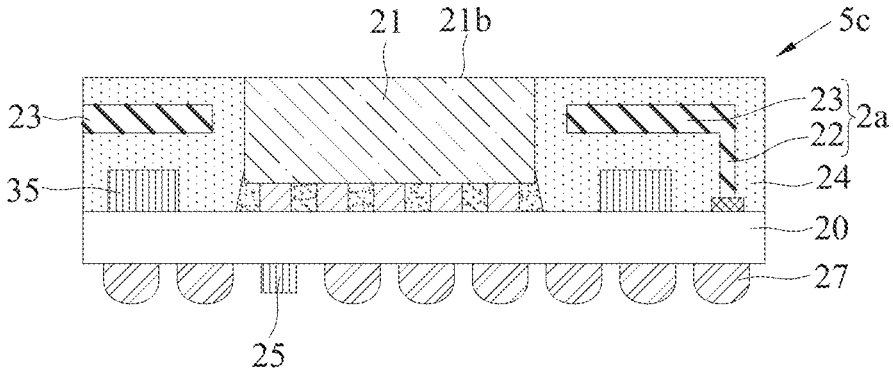

FIGS. 5A to 5C are schematic cross-sectional views of a second embodiment of a manufacturing method of an electronic package 5 of the present invention. The difference between this embodiment and the first embodiment lies in the singulation process, so the similarities will not be repeated in the following.

As shown in FIG. 5A, the singulation process is performed along the periphery of the supporting structure 2a (the cutting path L shown in FIG. 2C) to produce the electronic package 5 of the present invention, and the supporting leg 22 of the supporting structure 2a is retained.

In this embodiment, the supporting structure 2a is embedded completely in the packaging layer 24 without being exposed from the packaging layer 24. In another embodiment, as in an electronic package 5b shown in FIG. 5B, the frame body 23 of the supporting structure 2a can be exposed from the first surface 24a of the packaging layer 24.

It should be understood that the cutting path of the singulation process can be set according to requirements, such as an electronic package 5c shown in FIG. 5C (with the supporting leg 22 partially retained), and there is no particular limitation.

Therefore, the manufacturing method of the present invention employs mainly a design of the frame body 23 to disperse thermal stress and avoid warpage during thermal cycles.

Furthermore, the frame body 23 is provided on the first side 20a of the wiring structure 20 by the supporting leg 22, and a width R of the supporting leg 22 is much smaller than a width D of the conventional dummy block 12 (as shown in FIG. 1). As a result, the supporting leg 22 occupies very little surface area of the wiring structure 20, facilitating the arrangement of other electronic components (such as the passive component 35) around the electronic component 21, wherein the passive component 35 is covered by the frame body 23. Therefore, compared with the prior art, the electronic package 5 of the present invention can have required wirings arranged on the surface of the first side 20*a* of its wiring structure 20 without increasing the size of the first side 20*a* of the wiring structure 20. Consequently, the electronic package of the present application can not only meet the demand for miniaturization, but also reduce manufacturing costs.

Figure 6A:
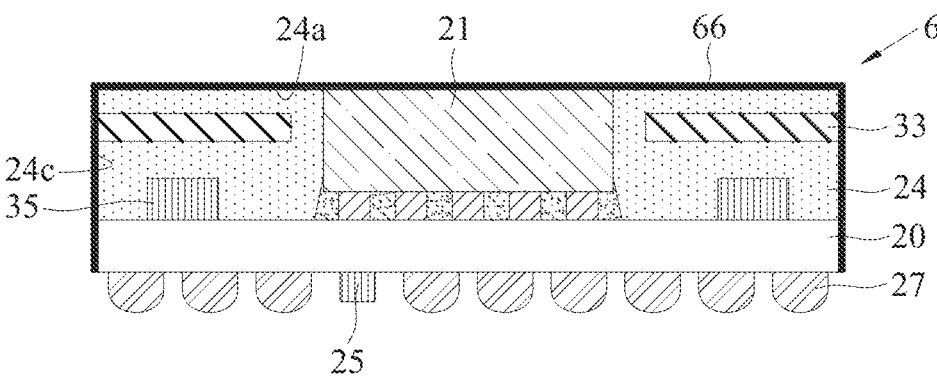
FIG. 6A is a schematic cross-sectional view of a third embodiment of a manufacturing method of an electronic package of the present invention.
Figure 6B:
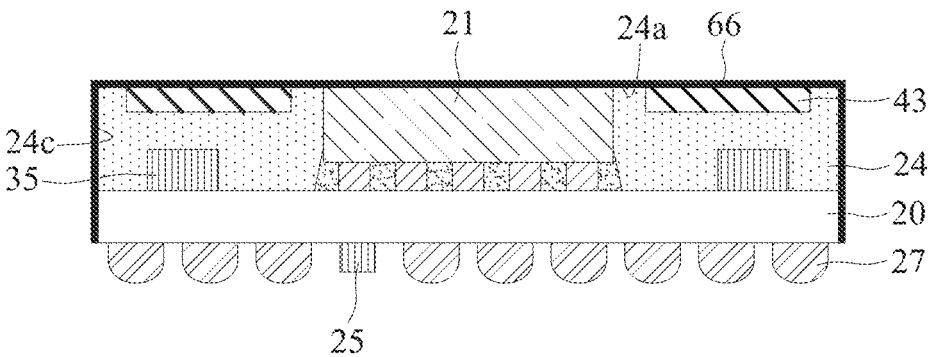
FIGS. 6B and 6C are schematic views of other different aspects of FIG. 6A.
Figure 6C:
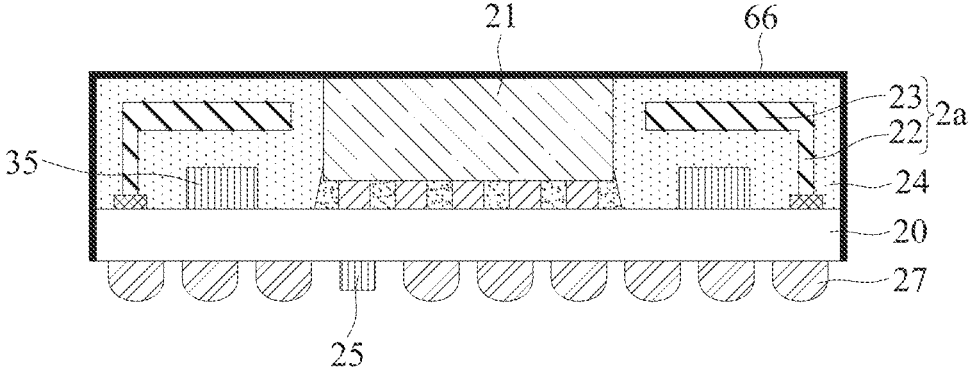

FIGS. 6A to 6C are schematic cross-sectional views of a third embodiment of a manufacturing method of an electronic package 6 of the present invention. The difference between this embodiment and the above-mentioned embodiments lies in the addition of a shielding process, so the similarities will not be repeated in the following.

As shown in FIG. 6A, based on the electronic package 3 of FIG. 3C-1, after the singulation process, a shielding layer 66 is formed on the side surface 24*c* and the first surface 24*a* of the packaging layer 24, and the shielding layer 66 contacts the frame body 33 on the side surface 24*c* of the packaging layer 24.

As shown in FIG. 6B, based on the aspect of FIG. 4A-2, the shielding layer 66 can also contact the frame body 43 on the first surface 24*a* of the packaging layer 24. Alternatively, as shown in FIG. 6C, based on the aspect of FIG. 5A, the shielding layer 66 may not contact the frame body 23.

It should be understood that the shielding layer 66 can be in contact with or not in contact with the electronic component 21 as required, and there is no particular limitation.

Therefore, the manufacturing method of the present invention adopts mainly a design of the shielding layer 66 to prevent the electronic component 21 from electromagnetic interference (EMI).

Figure 7A:
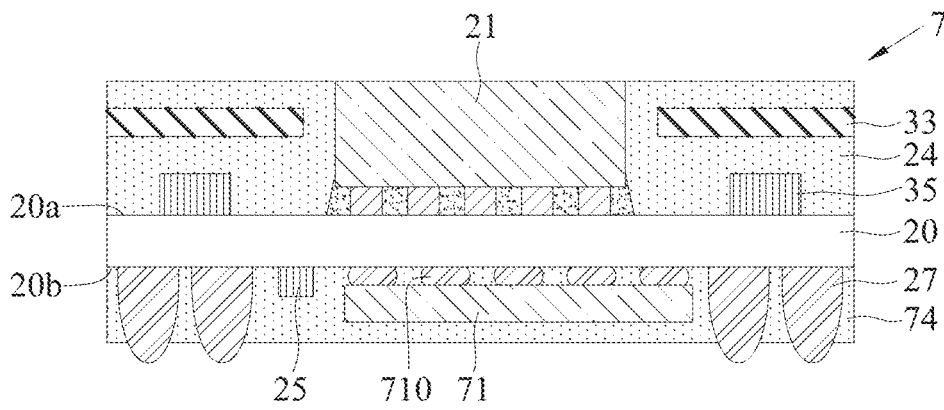
FIG. 7A is a schematic cross-sectional view of a fourth embodiment of a manufacturing method of an electronic package of the present invention.

FIG. 7A is a schematic cross-sectional view of a fourth embodiment of a manufacturing method of an electronic package 7 of the present invention. The difference between this embodiment and the above-mentioned embodiments lies in the addition of a packaging process, so the similarities will not be repeated in the following.

As shown in FIG. 7A, based on the electronic package 3 of FIG. 3C-1, another electronic component 71 is arranged on the second side 20*b* of the wiring structure 20. The electronic component 71 is a semiconductor chip, which can be arranged on the wiring structure 20 in a flip chip manner by a plurality of conductive bumps 710 such as solder materials, metal pillars or others, and is electrically connected to the wiring layer of the wiring structure 20. However, there are various ways to electrically connect the electronic component 71 to the wiring structure 20, and there are no particular limitations.

In this embodiment, another packaging layer 74 can be formed on the second side 20*b* of the wiring structure 20 in a way to cover the electronic component 71, the conductive bumps 710, the passive component 25 and the conductive components 27, wherein the conductive components 27 protrude from the packaging layer 74. For example, the packaging layer 74 is an insulating material, such as polyimide (PI), dry film, encapsulant such as epoxy or a molding compound such as epoxy, and can be formed on the second side 20*b* of the wiring structure 20 by a process selected from liquid compound, injection, lamination, compression molding or the like. It should be understood that the packaging layer 74 on the second side 20*b* and the packaging layer 24 on the first side 20*a* can be made of the same or different materials, and there are no particular limitations.

Figure 7B:
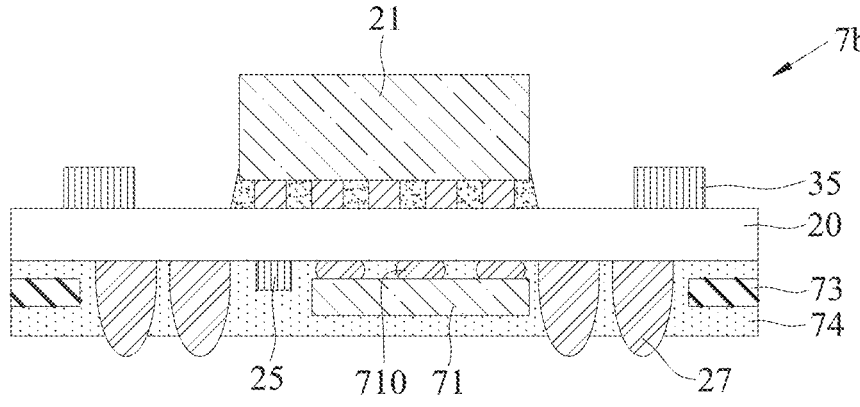
FIG. 7B is a schematic view of a different aspect of FIG. 7A.

Therefore, the wiring structure 20 can optionally be provided with the packaging layer 24, 74 and the frame body 33, 73 on at least one side thereof, as shown in an electronic package 7*b* of FIG. 7B, and there are no particular limitations.

Figures 1, 8A:
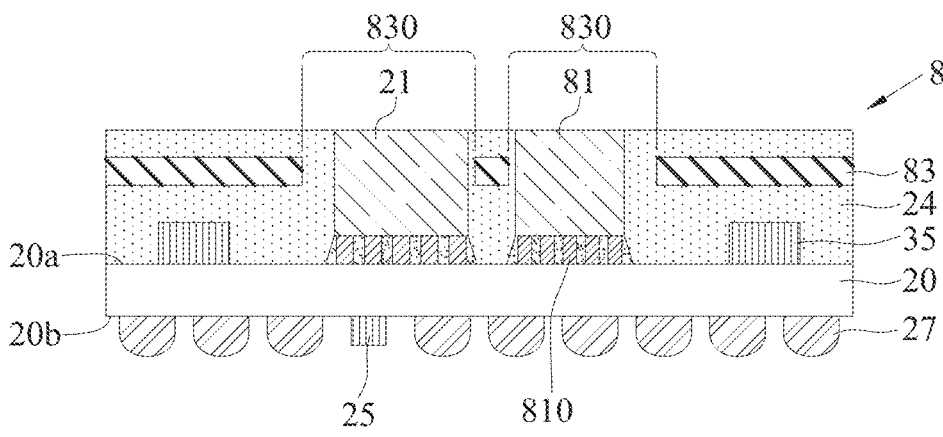
Figures 2, 8A:
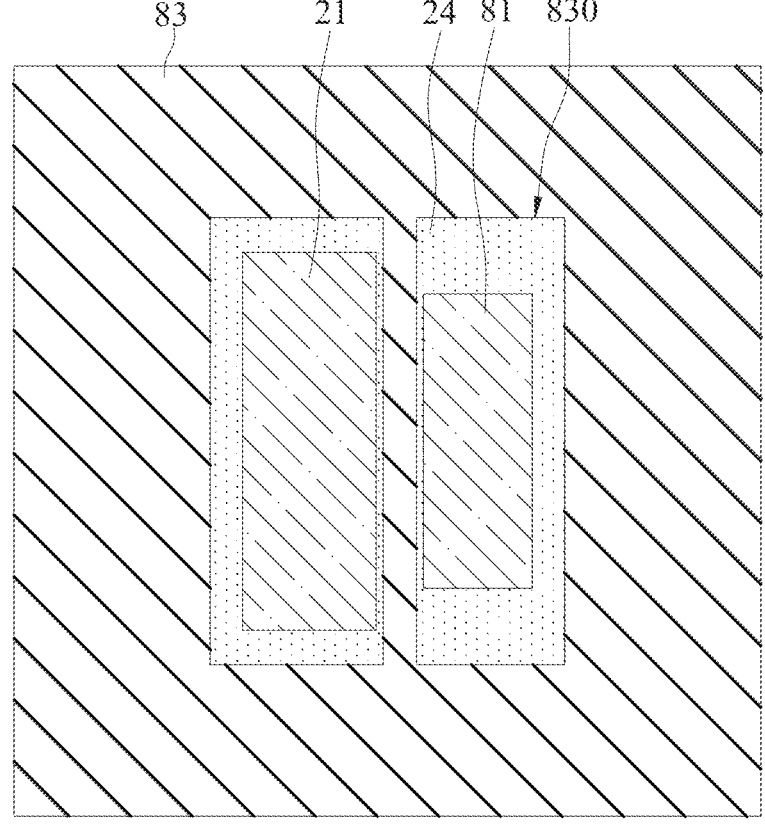

FIG. 8A-1 is a schematic cross-sectional view of a fifth embodiment of a manufacturing method of an electronic package 8 of the present invention. The difference between this embodiment and the above-mentioned embodiments lies in the number of electronic components, so the similarities will not be repeated in the following.

As shown in FIGS. 8A-1 and 8A-2, based on the electronic package 3 of FIGS. 3A and 3C-1, a frame body 83 has a plurality of opening areas 830, and a plurality of electronic components 21, 81 are provided on the first side 20*a* of the wiring structure 20, so that each of the electronic components 21, 81 is exposed from each of the opening areas 830.

Figures 1, 8B:
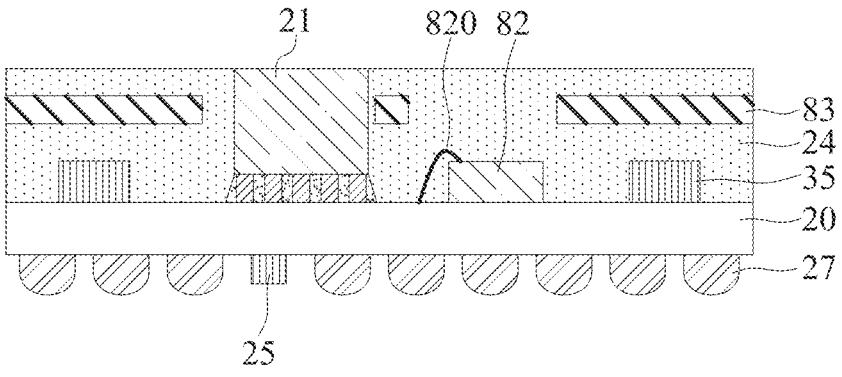
Figures 2, 8B:
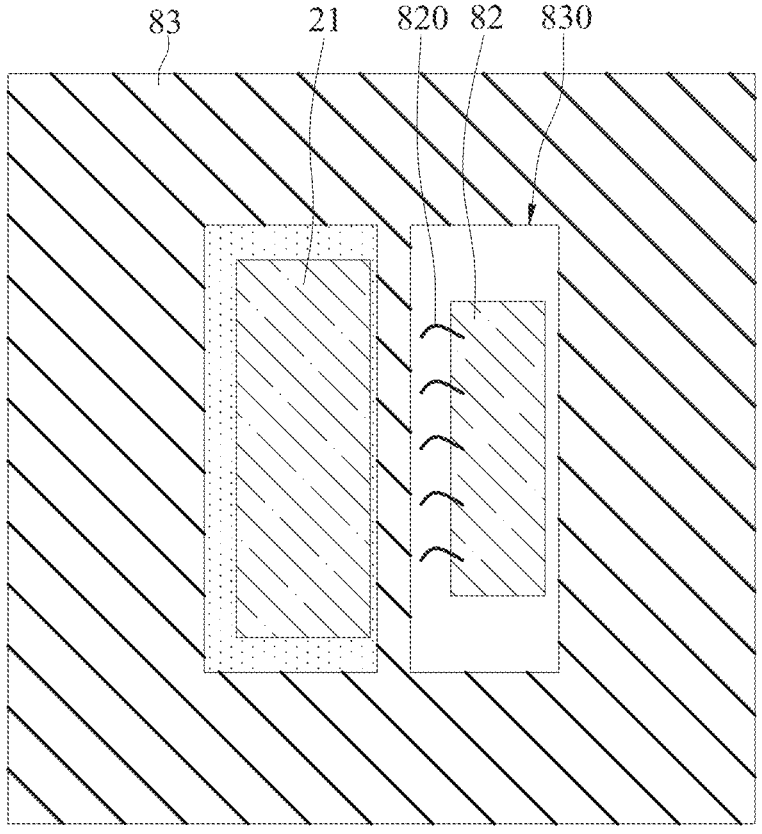

In this embodiment, the electronic component 81 is a semiconductor chip, which can be provided on the wiring structure 20 in a flip chip manner by a plurality of conductive bumps 810 such as solder materials, metal pillars or others, and is electrically connected to the wiring layer of the wiring structure 20. However, there are various ways to electrically connect the electronic component 81 to the wiring structure 20, such as the wire bonding shown in FIG. 8B-1 and FIG. 8B-2 (that is, an electronic component 82 is electrically connected to the wiring layer of the wiring structure 20 by a bonding wire 820), and there are no particular limitations.

The present invention also provides an electronic package 2, 3, 4, 4*b*, 4*c*, 5, 5*b*, 5*c*, 6, 7, 7*b*, 8, comprising: a wiring structure 20, at least one electronic component 21, 71,81,82, a packaging layer 24,74 and a frame body 23,33,43,73,83.

Said electronic component 21, 71, 81, 82 is arranged on the wiring structure 20 and electrically connected thereto.

Said packaging layer 24, 74 is formed on the wiring structure 20 to cover the electronic component 21, 71, 81, 82, wherein the packaging layer 24 has a first surface 24*a* and a second surface 24*a* opposite to each other and side surfaces 24*b* adjacent to the first and second surfaces 24*a*, 24*b*, and the packaging layer 24 is bonded to the wiring structure 20 via its second surface 24*b*.

Said frame body 23, 33, 43, 73, 83 is embedded in the packaging layer 24, 74, and the frame body 23, 33, 43, 73, 83 neither contacts the wiring structure 20 nor covers the electronic component 21,71,81,82.

In one embodiment, the electronic component 21, 81 is exposed from the first surface 24*a* of the packaging layer 24.

In one embodiment, the frame body 23, 33, 43, 83 is exposed from the side surface 24*c* and/or the first surface 24*a* of the packaging layer 24.

In one embodiment, the frame body 23, 33, 43, 83 is flush with the side surface 24*c* and/or the first surface 24*a* of the packaging layer 24.

In one embodiment, the frame body 23, 33, 43, 73, 83 is made of a metal or semiconductor material.

In one embodiment, the frame body 23, 33, 43, 73, 83 takes the shape of a ring to surround the electronic component 21, 71.

In one embodiment, the frame body 23, 33, 43, 73, 83 is suspended on the wiring structure 20.

In one embodiment, the frame body 23 is erected on the wiring structure 20 by supporting legs 22.

In one embodiment, said electronic package 3, 4, 4b, 5, 5b, 5c, 6, 7, 8 further comprises another electronic component (such as a passive component 35) provided on the wiring structure 20, and the frame body 23, 83 covers the another electronic component.

In one embodiment, said electronic package 6 further comprises a shielding layer 66 formed on the packaging layer 24.

In summary, the manufacturing method of the present invention adopts mainly a design of the frame body to disperse thermal stress and avoid warpage, so as to facilitate the arrangement of other electronic components around the electronic component. Therefore, the electronic package of the present invention allows for the arrangement of required wirings on a surface of its wiring structure without increasing the size of the wiring structure. As a result, it not only meets the demand for miniaturization, but also reduces manufacturing costs.

The foregoing embodiments are provided for the purpose of illustrating the principles and effects of the present invention, rather than limiting the present disclosure. Anyone skilled in the art can modify and alter the above embodiments without departing from the spirit and scope of the present disclosure. Therefore, the scope of protection claimed by the present disclosure should be as described in the accompanying Claims listed below.

What is claimed is:

1. An electronic package, comprising:
   a wiring structure;
   at least one electronic component provided on and electrically connected to the wiring structure;
   a packaging layer formed on the wiring structure to cover the at least one electronic component, wherein the packaging layer has a first surface and a second surface opposite to each other and side surfaces adjacent to the first and second surfaces, and the packaging layer is bonded to the wiring structure via the second surface thereof; and
   a frame body embedded in the packaging layer, wherein the frame body is provided on the wiring structure via supporting legs and not covering the at least one electronic component,
   wherein a height of the at least one electronic component relative to the wiring structure is greater than a height of a lower surface of the frame body relative to the wiring structure.

2. The electronic package of claim 1, wherein the at least one electronic component is exposed from the first surface of the packaging layer.

3. The electronic package of claim 1, wherein the frame body is exposed from the side surface and/or the first surface of the packaging layer.

4. The electronic package of claim 1, wherein the frame body is flush with the side surface and/or the first surface of the packaging layer.

5. The electronic package of claim 1, wherein the frame body is made of a metal or semiconductor material.

6. The electronic package of claim 1, wherein the frame body has a ring shape to surround the at least one electronic component.

7. The electronic package of claim 1, wherein the frame body is suspended on the wiring structure.

8. The electronic package of claim 1, wherein the frame body is erected on the wiring structure by the supporting legs.

9. The electronic package of claim 1, wherein the supporting legs are located inside the packaging layer.

10. The electronic package of claim 1, further comprising another electronic component provided on the wiring structure, wherein the another electronic component is covered by the frame body.

11. The electronic package of claim 1, further comprising a shielding layer formed on the packaging layer.

12. The electronic package of claim 1, wherein the frame body has a plurality of opening areas, and a plurality of electronic components are provided on the wiring structure in a manner that the plurality of electronic components are exposed respectively from the plurality of opening areas.

13. A manufacturing method of an electronic package, comprising:
   providing a frame body and at least one electronic component on a wiring structure, wherein the frame body is provided on the wiring structure via supporting legs and not covering the at least one electronic component, and wherein a height of the at least one electronic component relative to the wiring structure is greater than a height of a lower surface of the frame body relative to the wiring structure; and
   forming a packaging layer on the wiring structure to cover the at least one electronic component and the frame body, wherein the packaging layer has a first surface and a second surface opposite to each other and side surfaces adjacent to the first and second surfaces, so that the packaging layer is bonded to the wiring structure via the second surface thereof.

14. The manufacturing method of an electronic package of claim 13, wherein the at least one electronic component is exposed from the first surface of the packaging layer.

15. The manufacturing method of an electronic package of claim 13, wherein the frame body is exposed from the side surface and/or the first surface of the packaging layer.

16. The manufacturing method of an electronic package of claim 13, wherein the frame body is flush with the side surface and/or the first surface of the packaging layer.

17. The manufacturing method of an electronic package of claim 13, wherein the frame body is made of a metal or semiconductor material.

18. The manufacturing method of an electronic package of claim 13, wherein the frame body has a ring shape to surround the at least one electronic component.

19. The manufacturing method of an electronic package of claim 13, wherein the frame body is suspended on the wiring structure.

20. The manufacturing method of an electronic package of claim 13, wherein the frame body is erected on the wiring structure by the supporting legs.

21. The manufacturing method of an electronic package of claim 13, wherein the supporting legs are located inside the packaging layer.

22. The manufacturing method of an electronic package of claim 13, further comprising providing another electronic component on the wiring structure, wherein the another electronic component is covered by the frame body.

23. The manufacturing method of an electronic package of claim 13, further comprising forming a shielding layer on the packaging layer.

24. The manufacturing method of an electronic package of claim 13, wherein the frame body has a plurality of opening areas, and a plurality of electronic components are provided on the wiring structure in a manner that the plurality of electronic components are exposed respectively from the plurality of opening areas.

* * * * *